US012667841B2

(12) United States Patent
Fan et al.

(10) Patent No.: US 12,667,841 B2
(45) Date of Patent: Jun. 30, 2026

(54) MICRO-FLUIDIC CHIP, LIBRARY PREPARATION CHIP AND METHOD FOR CONTROLLING AND DRIVING DROPLET

(71) Applicants: BEIJING BOE SENSOR TECHNOLOGY CO., LTD., Beijing (CN); BOE TECHNOLOGY GROUP CO., LTD., Beijing (CN)

(72) Inventors: Bolin Fan, Beijing (CN); Yingying Zhao, Beijing (CN); Le Gu, Beijing (CN); Wenliang Yao, Beijing (CN); Hui Liao, Beijing (CN); Yongjia Gao, Beijing (CN); Qiuxu Wei, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 873 days.

(21) Appl. No.: 17/419,846

(22) PCT Filed: Sep. 29, 2020

(86) PCT No.: PCT/CN2020/118863
§ 371 (c)(1),
(2) Date: Jun. 30, 2021

(87) PCT Pub. No.: WO2022/067513
PCT Pub. Date: Apr. 7, 2022

(65) Prior Publication Data
US 2022/0314216 A1 Oct. 6, 2022

(51) Int. Cl.
*B01L 3/00* (2006.01)
*B81B 1/00* (2006.01)

(52) U.S. Cl.
CPC .......... *B01L 3/50273* (2013.01); *B81B 1/006* (2013.01); *B01L 2300/161* (2013.01);
(Continued)

(58) Field of Classification Search
CPC .......... B01L 3/50273; B01L 2300/161; B01L 2400/0424; B01L 2200/16;
(Continued)

(56) References Cited

U.S. PATENT DOCUMENTS

2004/0055536 A1* 3/2004 Kolar .................... B01L 3/0241
506/40
2006/0193730 A1* 8/2006 Rosenstein .......... B01L 3/0293
417/53
(Continued)

FOREIGN PATENT DOCUMENTS

CN 103170384 A 6/2013
CN 107118955 A 9/2017
(Continued)

*Primary Examiner* — Benjamin R Whatley
*Assistant Examiner* — Curtis A Thompson
(74) *Attorney, Agent, or Firm* — Nath, Goldberg & Meyer; Joshua B. Goldberg

(57) ABSTRACT

A micro-fluidic chip is provided. The micro-fluidic chip includes: a first base substrate; a first electrode on the first base substrate and electrically coupled to a wire at a driving end; a second electrode on a side of the first electrode away from the first base substrate and spaced apart and electrically insulated from the first electrode, the second electrode including a plurality of sub-blocks of the second electrode, and an orthographic projection of the second electrode on the first base substrate being at least partially overlapped with an orthographic projection of the first electrode on the first base substrate; and voltage-dividing resistors coupled to the plurality of sub-blocks of the second electrode in one-to-one correspondence and electrically coupled to a ground wire.

13 Claims, 14 Drawing Sheets

(52) U.S. Cl.
CPC . *B01L 2400/0424* (2013.01); *B81B 2201/057* (2013.01); *B81B 2203/0338* (2013.01); *B81B 2203/04* (2013.01)

(58) Field of Classification Search
CPC .............. B01L 3/502792; B81B 1/006; B81B 2201/057; B81B 2203/0338; B81B 2203/04
See application file for complete search history.

(56) References Cited

U.S. PATENT DOCUMENTS

| | | | | | |
|---|---|---|---|---|---|
| 2008/0018709 | A1* | 1/2008 | Takenaka | .............. | F04B 19/006 |
| | | | | | 347/58 |
| 2008/0169195 | A1 | 7/2008 | Jones et al. | | |
| 2009/0128106 | A1* | 5/2009 | Takahashi | .............. | G05F 1/575 |
| | | | | | 323/277 |
| 2010/0181195 | A1* | 7/2010 | Garcia Tello | ....... | B01F 33/3031 |
| | | | | | 204/600 |
| 2010/0190263 | A1* | 7/2010 | Srinivasan | ......... | B01F 33/3031 |
| | | | | | 422/534 |
| 2010/0236927 | A1 | 9/2010 | Pope et al. | | |
| 2011/0076734 | A1* | 3/2011 | Zhou | ...................... | B33Y 30/00 |
| | | | | | 435/283.1 |

| | | | | | |
|---|---|---|---|---|---|
| 2012/0256519 | A1* | 10/2012 | Tomiyoshi | ............ | B06B 1/0292 |
| | | | | | 310/300 |
| 2013/0293246 | A1* | 11/2013 | Pollack | ................ | B41J 2/04555 |
| | | | | | 324/663 |
| 2014/0014517 | A1* | 1/2014 | Srinivasan | ....... | G01N 27/44743 |
| | | | | | 204/601 |
| 2016/0175859 | A1* | 6/2016 | Yi | ........................... | G01F 23/22 |
| | | | | | 239/690 |
| 2017/0315090 | A1* | 11/2017 | Wheeler | .............. | G01N 27/403 |
| 2019/0111433 | A1* | 4/2019 | French | ............. | B01L 3/502792 |
| 2019/0136307 | A1* | 5/2019 | Predki | .................. | C12Q 1/6869 |
| 2019/0329259 | A1* | 10/2019 | Wu | .................. | B01L 3/502792 |
| 2019/0351418 | A1* | 11/2019 | Lv | ...................... | G01N 15/1023 |
| 2021/0208715 | A1* | 7/2021 | Yang | ..................... | H10K 50/82 |
| 2021/0346891 | A1* | 11/2021 | Geng | .............. | B01L 3/502792 |
| 2022/0305495 | A1* | 9/2022 | Frozanpoor | .............. | B08B 6/00 |

FOREIGN PATENT DOCUMENTS

| | | | | | |
|---|---|---|---|---|---|
| CN | 107754962 | A | 3/2018 | | |
| JP | 4425872 | B2 | 3/2010 | | |
| WO | WO-2019041955 | A1 * | 3/2019 | ........... | B01L 3/5027 |
| WO | WO-2019100575 | A1 * | 5/2019 | ......... | B01L 3/50273 |
| WO | WO-2019134559 | A1 * | 7/2019 | ........... | B01L 3/5027 |

* cited by examiner

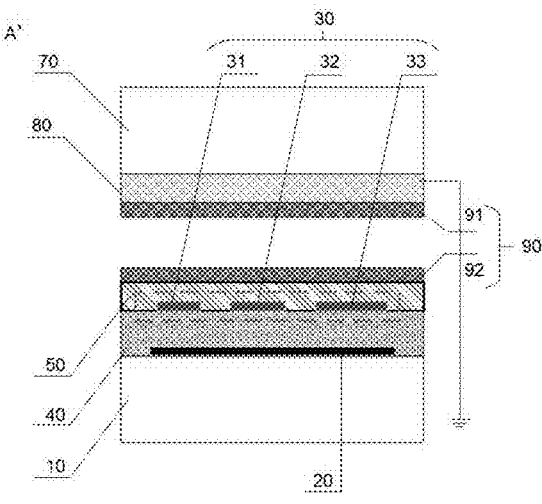
Fig. 4a
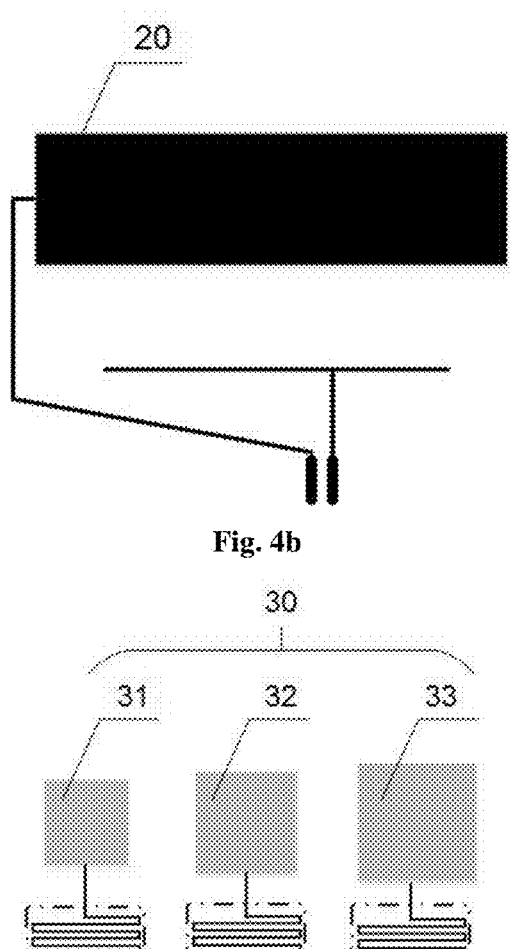
Fig. 4b
Fig. 4c

MICRO-FLUIDIC CHIP, LIBRARY PREPARATION CHIP AND METHOD FOR CONTROLLING AND DRIVING DROPLET

CROSS REFERENCE TO RELATED APPLICATION

This is a National Phase Application filed under 35 U.S.C. 371 as an International Application of PCT/CN2020/118863, filed on Sep. 29, 2020 the disclosure of which is incorporated herein by reference.

TECHNICAL FIELD

The present disclosure relates to the technical field of micro-fluidic chips, in particular to a micro-fluidic chip, a library preparation chip and a method for controlling and driving a droplet.

BACKGROUND

The micro-fluidic technology is a technology for precisely controlling and manipulating micro-scale fluids, and by using the technology, researchers can integrate basic operations, such as sample preparation, reaction, separation, detection and the like, on a centimeter-level chip. The technology is generally applied to the analysis process of trace drugs in biology, chemistry, pharmacy and the like.

Library preparation is an important step in the gene sequencing process, aims to increase the concentration of DNA to be detected, and is prepared for subsequent sequencing operation. Because the steps of library preparation are complex and involve more sample operations, the digital micro-fluidic chip has huge application potential in the field of library preparation by virtue of the advantages of high liquid control precision, programmable liquid path and the like.

Due to the great cost advantage, the passive digital micro-fluidic chip is the mainstream chip scheme in the current commercialized digital micro-fluidic chip products. But for the passive digital micro-fluidic chip, its driving electrodes are in one-to-one correspondence with the bonding electrodes, so that n bonding electrodes are needed when controlling of n driving electrodes is required. This undoubtedly limits the quantity of the driving electrodes on the passive digital micro-fluidic chip, and thus limits the improvement of integrated level of the passive digital micro-fluidic chip, which is unfavorable for the development of the integration and miniaturization of the chip. In addition, the movement speed of the droplet in the passive digital micro-fluidic chip is mostly determined by the on-off switching time of the electrode, namely, by the response time of the relay. Generally, the response time of a single relay is in the order of tens of milliseconds, and thus the movement speed is limited.

SUMMARY

Embodiments of the present disclosure provide a micro-fluidic chip, a library preparation chip and a method for controlling and driving a droplet, which, by utilizing the coupling voltage effect, significantly improves the transport speed of chip for the droplets and reduces bonding, thereby reducing the quantity of used electrodes.

To solve the above problems, technical solutions provided by the embodiments of the present disclosure are as follows.

In a first aspect, embodiments of the present disclosure provide a micro-fluidic chip, including:
  a first base substrate;
  a first electrode on the first base substrate and electrically coupled to a wire at a driving end;
  a second electrode on a side of the first electrode away from the first base substrate and spaced apart and electrically insulated from the first electrode, the second electrode including a plurality of sub-blocks of the second electrode, and an orthographic projection of the second electrode on the first base substrate being at least partially overlapped with an orthographic projection of the first electrode on the first base substrate; and
  voltage-dividing resistors coupled to the plurality of sub-blocks of the second electrode in one-to-one correspondence and electrically coupled to a ground wire.

In some embodiments, resistance values of the voltage-dividing resistors gradually increase in a first direction; an insulating layer is disposed between the first electrode and the second electrode, and a thickness of the insulating layer is uniform in a region corresponding to the first electrode; and overlapping areas of the orthographic projection of the first electrode on the first base substrate and the orthographic projection of the second electrode on the first base substrate are the same.

In some embodiments, the first electrode includes a plurality of sub-blocks of the first electrode spaced apart from each other in the first direction, having the same shape and coupled to each other, and each of the plurality of sub-blocks of the first electrode has a same shape as each of the plurality of sub-blocks of the second electrode; and an orthographic projection of a sub-block of the plurality of sub-blocks of the first electrode on the first base substrate and an orthographic projection of a respective sub-block of the plurality of sub-blocks of the second electrode on the first base substrate coincide.

In some embodiments, the plurality of sub-blocks of the second electrode are equally spaced along the first direction.

In some embodiments, the resistance values of the voltage-dividing resistors satisfy a condition that voltages of the plurality of sub-blocks of the second electrode linearly increase in the first direction.

In some embodiments, resistance values of the voltage-dividing resistors are the same; an insulating layer is disposed between the first electrode and the second electrode, and a thickness of the insulating layer is uniform in a region corresponding to the first electrode; and overlapping areas of the orthographic projection of the first electrode on the first base substrate and orthographic projections of the plurality of sub-blocks of the second electrode on the first base substrate gradually reduce in a first direction.

In some embodiments, the orthographic projection of the second electrode on the first base substrate is within the orthographic projection of the first electrode on the first base substrate; and areas of the plurality of sub-blocks of the second electrode gradually reduce in the first direction.

In some embodiments, the plurality of sub-blocks of the second electrode are the same in shape; and orthographic projections of the plurality of sub-blocks of the second electrode on the first base substrate are partially overlapped with the orthographic projections of the plurality of sub-blocks of the first electrode on the first base substrate, and overlapping areas of the orthographic projections of the plurality of sub-blocks of the second electrode on the first base substrate and the orthographic projections of the plurality of sub-blocks of the first electrode of the first electrode on the first base substrate gradually reduce in a first direction.

In some embodiments, the overlapping areas of the orthographic projection of the first electrode on the first base substrate and the orthographic projections of the plurality of sub-blocks of the second electrode on the first base substrate satisfy a condition that voltages of the plurality of sub-blocks of the second electrode linearly increase in the first direction.

In some embodiments, the micro-fluidic chip further includes a third electrode coupled to the first electrode.

In some embodiments, the third electrode and the second electrode are disposed in a same layer, an insulating layer is disposed between the first electrode and a fourth electrode, and the third electrode is coupled to the first electrode through a first via hole penetrating through the insulating layer.

In some embodiments, the ground wire and the first electrode are disposed in a same layer, the voltage-dividing resistors and the second electrode are disposed in a same layer, an insulating layer is disposed between the voltage-dividing resistors and the ground wire, and the ground wire is coupled to the voltage-dividing resistors one by one through a second via hole penetrating through the insulating layer.

In some embodiments, a number of the plurality of sub-blocks of the second electrode is from 2 to 4.

In some embodiments, the micro-fluidic chip further includes a sample distribution module, a reagent distribution module, a mixing module, a reaction module, a washing module, and a sample output module, where the sample distribution module, the reagent distribution module and the sample output module are coupled to other modules through a structure of the micro-fluidic chip; and each of the mixing module, the reaction module and the washing module includes a structure of the micro-fluidic chip.

In a second aspect, embodiments of the present disclosure provide a method for controlling and driving a droplet to quickly transport the droplet. The method includes providing a signal to the first electrode to drive the droplet to move.

In some embodiments, the signal is an alternating current signal having an effective value from 10 Vrms to 70 Vrms.

BRIEF DESCRIPTION OF THE DRAWINGS

The accompanying drawings, which are included to provide a further understanding of the embodiments of the present disclosure and are incorporated in and constitute a part of this specification, together with the detailed description serve to explain the embodiments of the present disclosure, but do not limit the embodiments. In the drawings:

FIG. 4a is a schematic cross-sectional view of the structure of FIG. 4 taken along the direction BB';

FIG. 4b is a schematic top view of the first electrode of the structure of FIG. 4;

FIG. 4c is a schematic top view of the second electrode and the voltage-dividing resistor of the structure of FIG. 4;

REFERENCE NUMERALS

Figure 1:
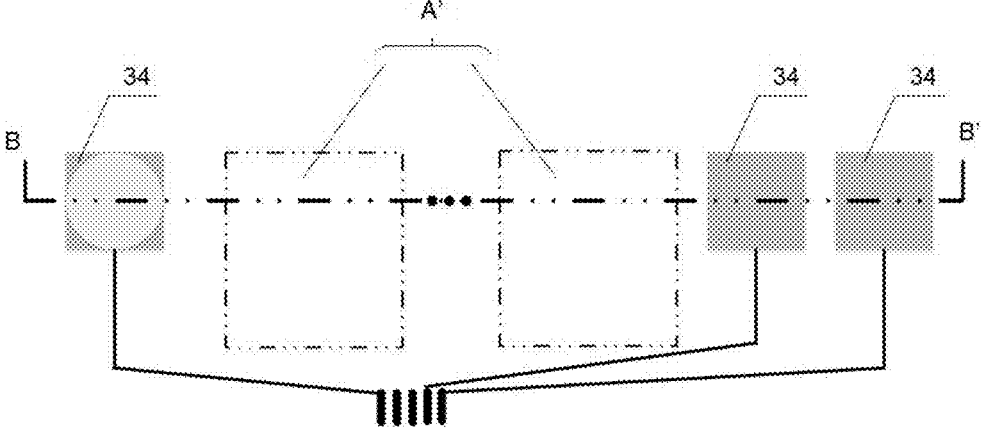
FIG. 1 is a schematic top view of a micro-fluidic chip provided in an embodiment of the present disclosure.

100—a micro-fluidic chip; 10—a first base substrate; 20—a first electrode; 30—a second electrode; 31—a first sub-block of the second electrode; 32—a second sub-block of the second electrode; 33—a third sub-block of the second electrode; 34—an electrode block; 35—a third electrode; 40—an insulating layer; 42—a second via hole; 43—a third via hole; 50—a dielectric layer; 60—a voltage-dividing resistor; 61—a first voltage-dividing resistor; 62—a second voltage-dividing resistor; 63—a third voltage-dividing resistor; 70—a second base substrate; 80—a fourth electrode; 90—a lyophobic layer; 91—a first lyophobic layer; 92—a second lyophobic layer; 101—a sample distribution module; 102—a reagent distribution module; 103—a mixing module; 104—a reaction module; 105—a washing module; 106—a sample output module; and A'—a fast-channel functional region.

DETAILED DESCRIPTION

Reference will now be made in detail to the exemplary embodiments, examples of which are illustrated in the accompanying drawings. When the following description refers to the drawings, unless otherwise indicated, the same numbers in different drawings indicate the same or similar elements. The embodiments described in the exemplary embodiments below do not represent all embodiments consistent with the present application. Rather, they are merely examples of devices and methods consistent with certain aspects of the application, as detailed in the appended claims.

The terminology used in the embodiments of the present disclosure is for the purpose of describing particular embodiments only and is not intended to be limiting of the application. As used in this application and the appended claims, the singular forms "a", "an", and "the" are intended to include the plural forms as well, unless the context clearly indicates otherwise. It should also be understood that the term "and/or" as used herein refers to and encompasses any and all possible combinations of one or more of the associated listed items.

It is to be understood that although the terms first, second, third, etc. may be used herein to describe various information in the embodiments of the present disclosure, such information should not be limited by these terms. These terms are only used to distinguish one type of information from another. For example, first information may also be referred to as second information, and similarly, second information may also be referred to as first information, without departing from the scope of the present application. Depending on the context, the word "if," as used herein, may be interpreted as "when . . . " or "in a case where . . . " or "in response to determining that . . . ".

Due to the great cost advantage, the passive digital micro-fluidic chip is the mainstream chip scheme in the current commercialized digital micro-fluidic chip products. But for the passive digital micro-fluidic chip, its driving electrodes are in one-to-one correspondence with the bonding electrodes, so that n bonding electrodes are needed when controlling of n driving electrodes is required. As described in the background, this undoubtedly limits the quantity of the driving electrodes on the passive digital micro-fluidic chip, and thus limits the improvement of the integrated level of the passive digital micro-fluidic chip, which is unfavorable for the development of the integration and miniaturization of the chip. In addition, the movement speed of the droplet in the passive digital micro-fluidic chip is mostly determined by the on-off switching time of the electrode, namely, by the response time of the relay. Generally, the response time of a single relay is in the order of tens of milliseconds, and thus the movement speed is limited.

In order to solve the above problems, embodiments of the present disclosure provide a micro-fluidic chip, a driving method and a library preparation chip device. The micro-fluidic chip, the driving method, and the library preparation chip device in the embodiments of the present disclosure are described in detail below with reference to the accompanying drawings. The features of the embodiments described below may complement or be combined with each other without conflict.

First Embodiment

Figure 1A:
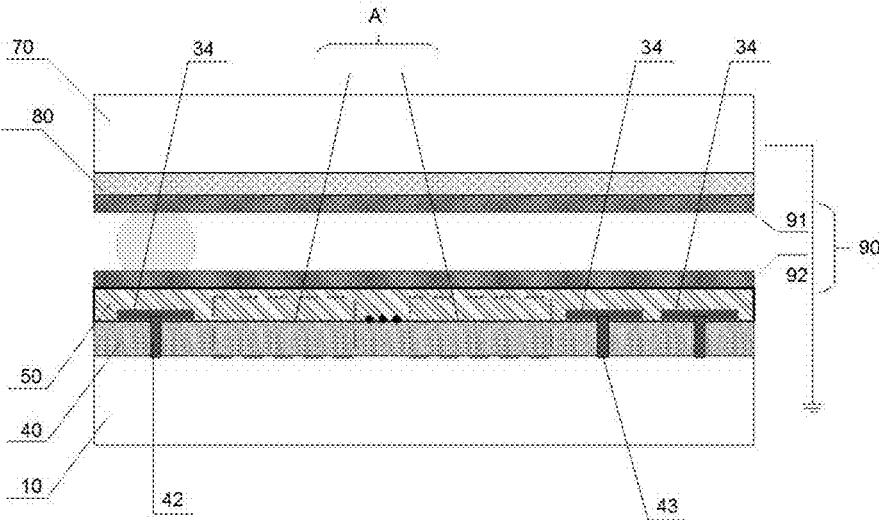
FIG. 1a is a schematic cross-sectional view of the micro-fluidic chip shown in FIG. 1 taken along a direction BB'.
Figure 2:
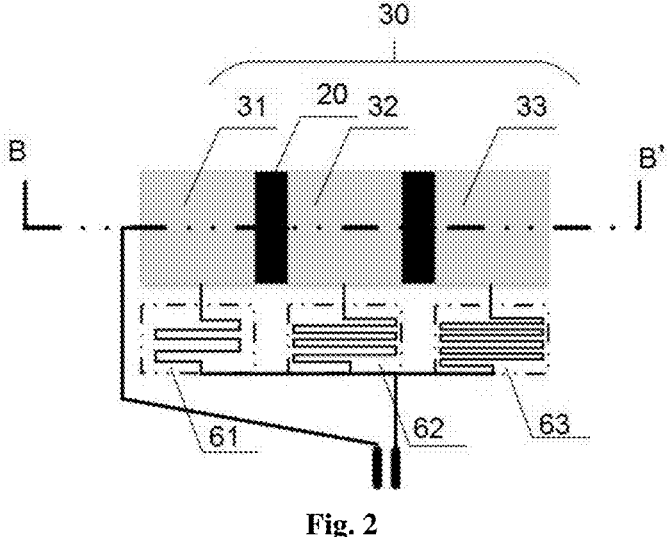
FIG. 2 is a schematic top view of an embodiment of a region A' of the micro-fluidic chip of FIG. 1.

An embodiment of the present disclosure provides a micro-fluidic chip. Referring to FIGS. 1 and 1a, the micro-fluidic chip protected by the present application includes a fast-channel functional region A'. Referring to FIGS. 2 to 2c, an embodiment of a structure of the fast-channel functional region A' is shown, in which a micro-fluidic chip 100 includes a first base substrate 10, a first electrode 20, a second electrode 30, an insulating layer 40, a dielectric layer 50, and a voltage-dividing resistor 60.

The first electrode 20 is located on a side of the first base substrate 10, the second electrode 30 is located on a side of the first electrode 20 away from the first base substrate 10, and the insulating layer 40 is located between the first electrode 20 and the second electrode 30 for preventing a short circuit between the first electrode 20 and the second electrode 30. The first electrode 20 is coupled to a wire, and the second electrode 30 includes a first sub-block 31 of the second electrode, a second sub-block 32 of the second electrode, and a third sub-block 33 of the second electrode. An orthographic projection of the second electrode 30 on the first base substrate 10 is positioned within an orthographic projection of the first electrode 20 on the first base substrate 10, thereby forming a capacitor.

The first electrode 20 is a strip electrode, and overlapping areas of the orthographic projection of the first electrode 20 on the first base substrate 10 and the orthographic projection of the second electrode 30 on the first base substrate 10 are the same.

In one embodiment, the plurality of sub-blocks of the second electrode are equally spaced along a first direction, so as to ensure that the capacitances formed between the first electrode 20 and respective sub-blocks of the second electrode are the same.

Figure 2A:
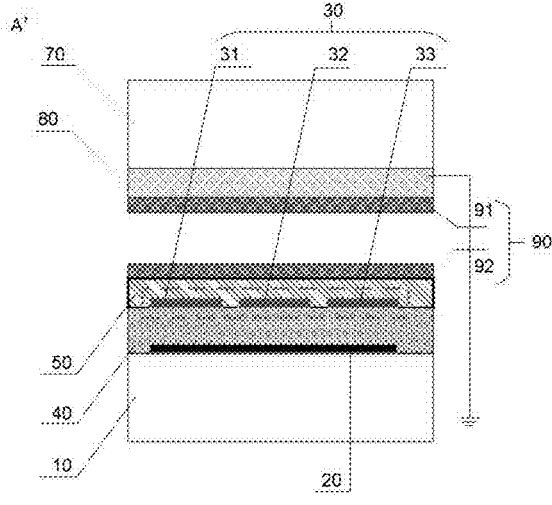
FIG. 2a is a schematic cross-sectional view of the structure of FIG. 2 taken along the direction BB'.
Figure 2B:
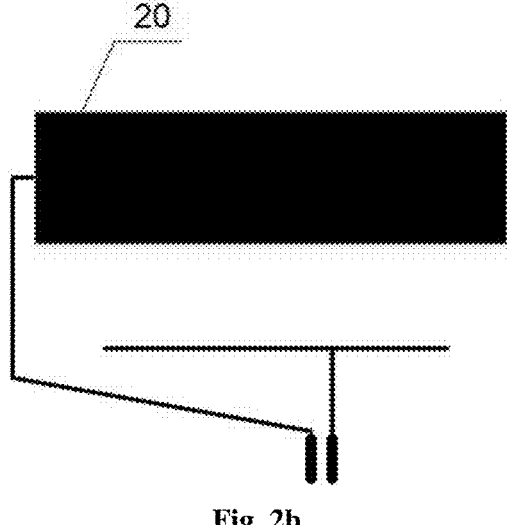
FIG. 2b is a schematic top view of the first electrode of the structure of FIG. 2.
Figure 2C:
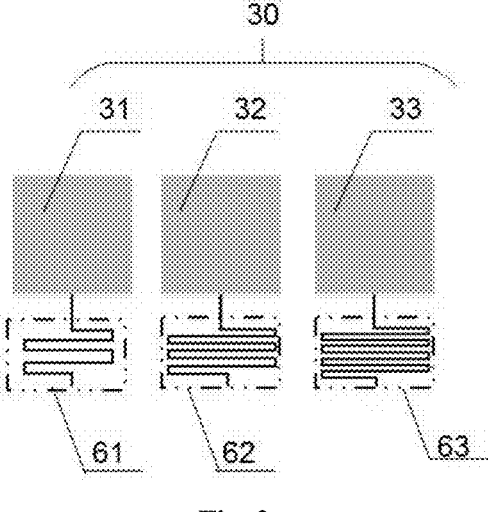
FIG. 2c is a schematic top view of the second electrode and the voltage-dividing resistor of the structure of FIG. 2.

As shown in FIGS. 2a and 2c, one end of a first voltage-dividing resistor 61, one end of a second voltage-dividing resistor 62, and one end of a third voltage-dividing resistor 63 are coupled to the first sub-block 31, the second sub-block 32 and the third sub-block 33 of the second electrode, respectively, and the other end of each of the three voltage-dividing resistors is coupled to a ground wire through a first via (not shown) in the insulating layer. The number of the voltage-dividing resistors are not limited to three as shown in the figures, and there may be n voltage-dividing resistors, where $1<n<5$, and n is an integer. The resistance values of the first voltage-dividing resistor 61, the second voltage-dividing resistor 62, and the third voltage-dividing resistor 63 sequentially increase, where the resistance values of the voltage-dividing resistors are not limited to the above rule, and may sequentially increase in a first direction, which is a direction in which the droplet is predicted to flow. The obtained coupling voltage of a sub-block of the second electrode coupled to a corresponding voltage-dividing resistor is positively correlated with the resistance value of the coupled voltage-dividing resistor, and is used for driving a corresponding droplet to quickly pass through.

In order to enable the droplet to move at a uniform speed in the channel, the resistance values of the voltage-dividing resistors are set to satisfy the condition that divided voltages of respective sub-blocks of the second electrode linearly increase in the first direction.

In addition, as shown in FIG. 1, the micro-fluidic chip further includes an electrode block 34 and a third electrode 35, where the electrode block 34 and the third electrode 35 are disposed in the same layer as the second electrode 30 and are located at two ends of the second electrode 30, and are used for sending out and receiving droplets, respectively.

As shown in FIG. 1a, the micro-fluidic chip further includes a second base substrate 70 opposite to the first base substrate 10, a fourth electrode 80 and a lyophobic layer 90. The fourth electrode 80 is located on a side of the second base substrate 70 facing the first base substrate 10, a first lyophobic layer 91 is located on a side of the fourth electrode 80 away from the second base substrate 70, and a second lyophobic layer 92 is located on a side of the second electrode 30 away from the first base substrate; and the first lyophobic layer 91 and the second lyophobic layer 92 are spaced apart by a predetermined distance, allowing droplets to move between the first lyophobic layer 91 and the second lyophobic layer 92.

When the micro-fluidic chip operates, driving voltages are applied to the electrodes at both sides of the flow channel, and droplets can be driven to flow in the flow channel. In the embodiments of the present disclosure, a common voltage is applied to the fourth electrode 80, a driving voltage is applied to the first electrode 20, and due to the coupling voltage effect, different voltage values are occurred to the first sub-block 31, the second sub-block 32, and the third sub-block 33 of the second electrode corresponding to the first electrode 20, respectively, so as to drive the droplet to move quickly through a designated area, thereby avoiding that the movement time of the droplet is determined by the on-off switching time of the electrode, namely, by the response time of the relay, and accelerating the movement speed of the droplet.

The micro-fluidic chip may include a functional region and a bonding region, where the micro-fluidic chip 100 includes the first base substrate 10, the first electrode 20, the second electrode 30, the insulating layer 40, the dielectric layer 50, the voltage-dividing resistor 60, the second base substrate 70, the fourth electrode 80, and the lyophobic layer 90. The bonding region may be provided with wires, which are in the same layer as the first electrode 20, respective one ends of the wires are used for coupling to the first electrode 20, the second electrode 30 and the voltage-dividing resistor 60, and the other ends thereof are coupled to signal terminals. In the present application, the voltage-dividing resistor 60 is coupled to a wire through a first via hole, the electrode block 34 and the third electrode 35 are coupled to respective wires through the second via hole 42 and the third via hole 43, respectively, and the signal terminals are used for inputting corresponding signals to charge corresponding electrodes to control the movement of droplets.

In one embodiment, the first base substrate 10 may be a flexible substrate or a rigid substrate. The material of the flexible substrate may be one or more of PET (polyethylene terephthalate), PI (polyimide), and PC (polycarbonate). The material of the rigid substrate may be glass, PMMA (polymethyl methacrylate), or the like.

In one embodiment, the material of the insulating layer 40 may include at least one of silicon oxide, silicon nitride and resin, and the thickness of the insulating layer 40 may be 380 nm to 420 nm, preferably 400 nm.

In one embodiment, the material of the first electrode 20 is a metal material, such as silver, copper, or molybdenum, and the thickness of the material of the first electrode may be 200 nm to 240 nm, preferably 220 nm; the material of the second electrode 30 is a transparent electrode material, such as indium gallium zinc oxide, and the thickness of the first electrode 20 may be 50 nm to 54 nm, preferably 52 nm; the second electrode 30 includes a plurality of electrode blocks, which are not limited to the three electrode blocks as shown in the figures, and there may be n electrode blocks, where 1<n<5, and n is an integer. The size of each electrode block is 1 mm×1 mm, and the gap between adjacent electrode blocks is 10 μm; the material of the third electrode 35 is a transparent electrode material, and the thickness of the third electrode 35 may be 50 nm to 54 nm, preferably 52 nm.

In one embodiment, the material of the lyophobic layer 90 may be a material, the polarity of which is capable of being changed by changing the arrangement of electrons of the lyophobic material using an electric field, such as polytetrafluoroethylene, polyvinylidene tetrafluoroethylene; the thickness of the lyophobic material may be 80-120 nm, and preferably 100 nm.

Surface wettability is one of the main properties of solid surfaces, and if a liquid is uniformly dispersed on a surface without forming droplets, such a surface is considered to be inherently lyophilic, allowing the liquid to disperse. Conversely, if a droplet is formed on a surface from liquid, such a surface is considered to be inherently lyophobic. The wettability of a solid surface is typically determined by measuring contact angle (CA). In general, for liquid on a horizontal surface, the contact angle $\theta$ is considered to be the result of three different types of surface tension at the solid/liquid/gas interface, and is expressed by the Young's equation:

$$\cos\theta = \frac{\gamma_{sol-gas} - \gamma_{sol-liq}}{\gamma_{gas-liq}}$$

where, $\gamma_{sol\ gas}$, $\gamma_{sol\ liq}$ and $\gamma_{gas\ iiq}$ are a coefficient of surface tension between solid and gas, a coefficient of surface tension between solid and liquid, and a coefficient of surface tension between gas and liquid, respectively. Based on Young's equation, hydrophilia refers to that the contact angle of the droplet on the solid surface is less than 90°, and hydrophobicity refers to that the contact angle of the droplet on the solid surface is greater than 90°.

When no external electric field is applied, the droplet is kept in a lyophobic state and does not move. When a signal is applied to the second electrode, an electric field formed by a second alternating current (AC) signal changes the polarity of the material of the lyophobic layer of the electrode unit adjacent to the droplet, in which the non-polar material is changed into the polar material, which in turn changes the lyophobic state (contact angle $\theta$) on one side of the lyophobic layer into the lyophilic state (in which the contact angle $\theta$ is reduced), so that the balance of the droplet is broken, and the droplet is driven to move.

In one embodiment, it is required to ensure that the voltage-dividing resistor for the first sub-block 31 of the second electrode has a resistance value smaller than that of the voltage-dividing resistor for the second sub-block 32 of the second electrode, and the voltage-dividing resistor for the second sub-block 32 of the second electrode has a resistance value smaller than the voltage-dividing resistor for the third sub-block 33 of the second electrode. In an exemplary embodiment, line widths of the voltage-dividing resistors are all 5 μm, and the line length of the voltage-dividing resistor for the first sub-block 31 of the second electrode is 1179 μm, the corresponding resistance thereof is 448020Ω, the line length of the voltage-dividing resistor for the second sub-block 32 of the second electrode is 1683 μm, the corresponding resistance thereof is 639540Ω, the line length of the voltage-dividing resistor for the third sub-block 33 of the second electrode is 2333 μm, and the corresponding resistance thereof is 886540Ω. All the voltage-dividing resistors are coupled to a wire through a via hole, and the wire is coupled to the ground electrode of the bonding electrode.

The fabrication process of the micro-fluidic chip of the embodiments of the present disclosure includes the following steps. First, electrode units arranged in an array are fabricated on the first base substrate 10 through a patterning process, thereby forming a structure of the first electrode 20. Subsequently, the insulating layer 40 is deposited or coated on the first electrode 10. The insulating layer 40 is patterned to form via holes in which metal is deposited to form metal wires. Then, the second electrode 30 and the voltage-dividing resistor 60 arranged in an array are fabricated on the insulating layer 40 through a patterning process. Subsequently, the dielectric layer 50 is deposited or coated on the second electrode 30. A lyophobic layer 91 is then coated on the dielectric layer 50. The fabrication of the electrode unit, the coating of the dielectric layer and the coating of the lyophobic layer may adopt the existing mature production process, the details of which are not described here. The electrode in the electrode unit may be made of metal material, such as molybdenum (Mo) or aluminum (Al), or transparent conductive material, such as indium tin oxide (ITO) or indium zinc oxide (IZO). The number of the electrode units may be increased or decreased according to specific application scenarios, and the embodiment is not limited to a specific number.

Figure 9:
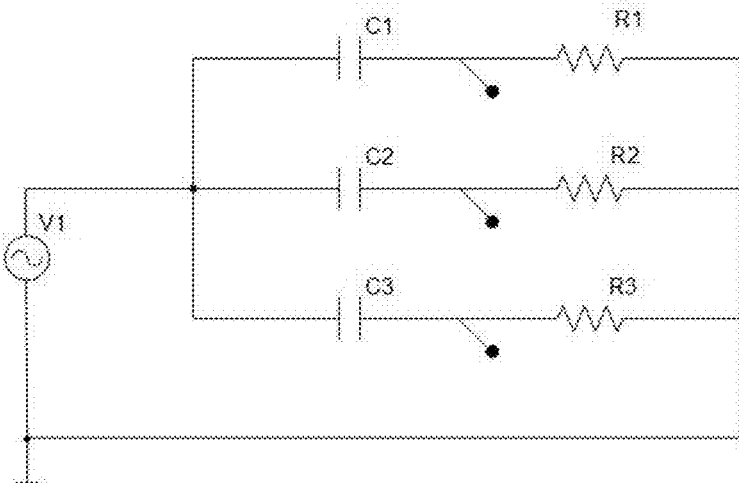
FIG. 9 is a schematic circuit diagram of a micro-fluidic chip provided in an embodiment of the present disclosure.
Figure 10:
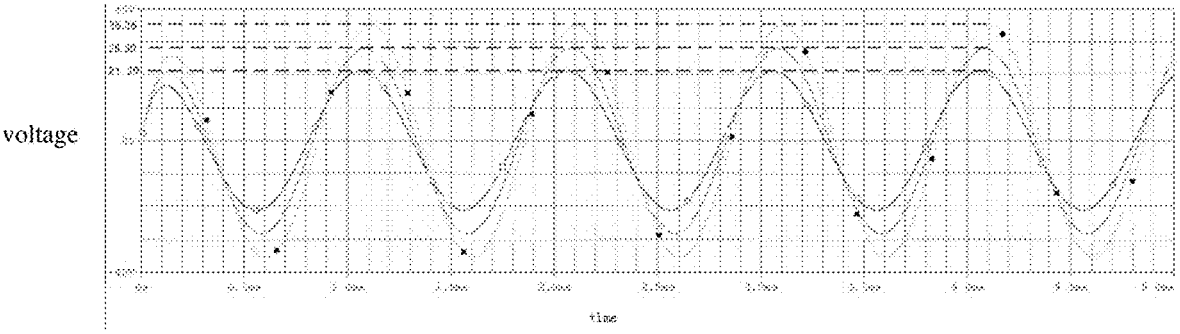
FIG. 10 is a schematic diagram illustrating voltage distribution of an electrode block in a second electrode according to an embodiment of the present disclosure.
Figure 11:
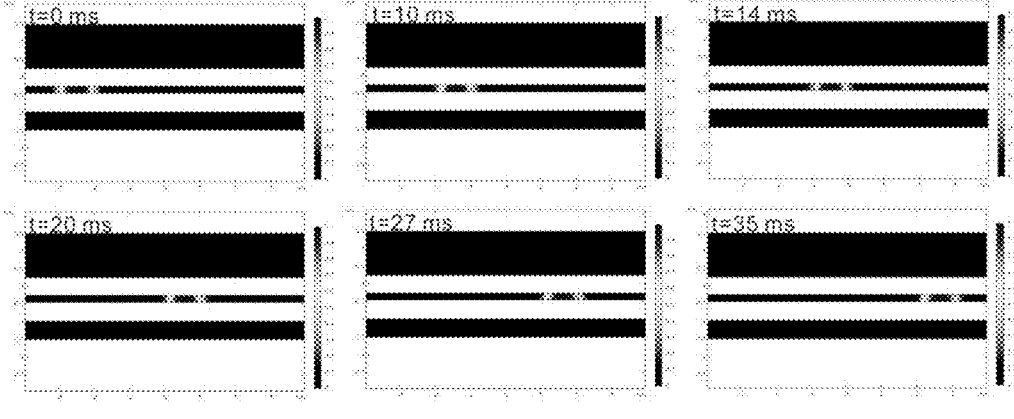
FIG. 11 is a schematic diagram illustrating a droplet movement simulation in a micro-fluidic chip provided in an embodiment of the present disclosure.

The working principle of the micro-fluidic chip described in this embodiment is described by taking the example that the second electrode 30 includes three electrode blocks. The present disclosure greatly improves the transport speed of the chip for the droplets by comprehensively utilizing the coupling voltage effect and the dielectric wetting effect, and significantly reduces the quantity of the used bonding electrodes, thereby improving the flow of the manipulated droplets. When the first electrode 20 is powered, the first sub-block 31 of the second electrode, the second sub-block 32 of the second electrode and the third sub-block 33 of the second electrode are coupled with corresponding voltages due to the coupling voltage effect. The coupling voltage of the sub-block can be described by the following formula:

$$U = U_I R / \sqrt{R^2 + \left(\frac{1}{\omega C}\right)^2}$$

Where $U_I$ is an input voltage, R is a voltage-dividing resistance, ω is an angular frequency, C is a coupling capacitance, and their expressions are respectively as follows:

$$R = R_\square L / W$$

$$\omega = \pi f$$

$$C = \varepsilon_r \varepsilon_0 s / d$$

Where $R_\square$ is a sheet resistance (square resistance) of indium gallium zinc oxide material, L is a line length of a voltage-dividing resistor, W is a line width of the voltage-dividing resistor, f is a frequency of an input voltage, $\varepsilon_0$ is a vacuum dielectric constant, $\varepsilon_r$ is a relative dielectric constant of an insulating layer, s is a facing area of an upper substrate and a lower substrate of a capacitor, where s=1 mm², and d is a thickness of the insulating layer. The circuit model of the first sub-block 31, the second sub-block 32 and the third sub-block 33 of the second electrode is shown in FIG. 9, in which reference numerals C1 to C3 correspond to the first to third capacitor formed between the first sub-block, the second sub-block and the third sub-block of the second electrode, and the first electrode shown in FIGS. 2a to 2c, respectively, R1 to R3 correspond to the first voltage-dividing resistor, the second voltage-dividing resistor and the third voltage-dividing resistor, and V1 is a power supply of 1 KHz 40 Vrms. The voltages of the first sub-block of the second electrode, the second sub-block of the second electrode and the third sub-block of the second electrode are 21 Vrms, 28 Vrms and 35 Vrms respectively, which are obtained by calculating based on the model (as shown in FIG. 10). It should be noted that the design of the resistances of the voltage-dividing resistors may be accomplished by those skilled in the art according to the above principle and the voltage required for actually driving the droplet. In this case, voltage differences exist among the first sub-block 31 of the second electrode, the second sub-block 32 of the second electrode, and the third sub-block 33 of the second electrode, and according to the dielectric wetting effect principle, the contact angle θ of a droplet and the voltage of the electrode below the droplet have the following relationship:

$$\cos\theta = \cos\theta_0 + (\varepsilon_r \varepsilon_0 U^2)/(2d_1 \gamma_{LG})$$

Where $\theta_0$ is an initial contact angle of the droplet, $d_1$ is a thickness of the dielectric layer, $\gamma_{LG}$ is a coefficient of surface tension between the droplet and air. However, the above formula does not consider the contact angle saturation effect. In the practical experiment, the initial contact angle of the droplet is 120° through measurement, and when the voltages of the electrodes are 21 Vrms, 28 Vrms, 35 Vrms and 40 Vrms, the contact angles of the droplet are 106°, 90°, 82° and 72°, respectively, so that a certain angle difference exists among the first sub-block 31 of the second electrode, the second sub-block 32 of the second electrode, the third sub-block 33 of the second electrode and the third electrode 35, and the left side and the right side of the droplet are deformed correspondingly. According to the knowledge of fluid mechanics, the droplet can obtain the thrust towards the third electrode, and therefore the droplet can be conveyed. From the simulation results, the movement speed of the droplet can reach 140 mm/s when the scheme is used, and the effect of quick transportation is achieved. The movement time of the droplet on different electrodes is shown in FIG. 11.

Second Embodiment

Figure 3:
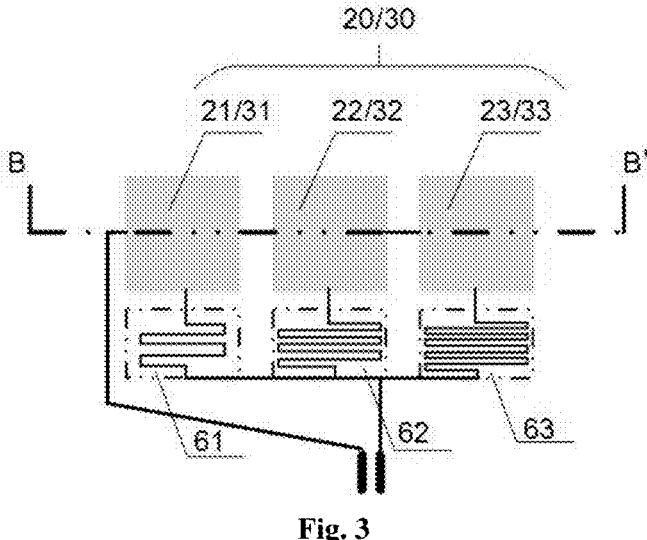
FIG. 3 is a schematic top view of another embodiment of the region A' of the micro-fluidic chip of FIG. 1.
Figure 3A:
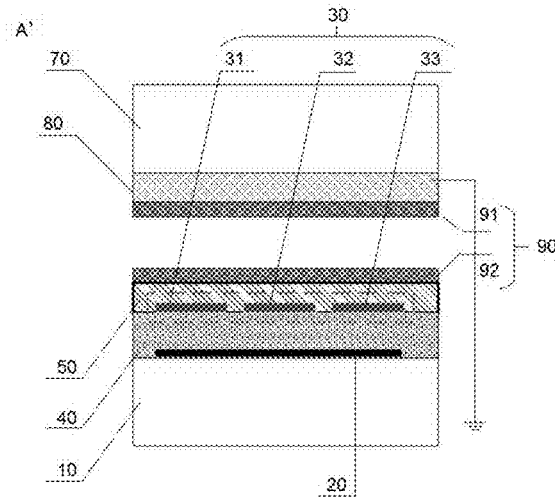
FIG. 3a is a schematic cross-sectional view of the structure of FIG. 3 taken along the direction BB'.
Figure 3B:
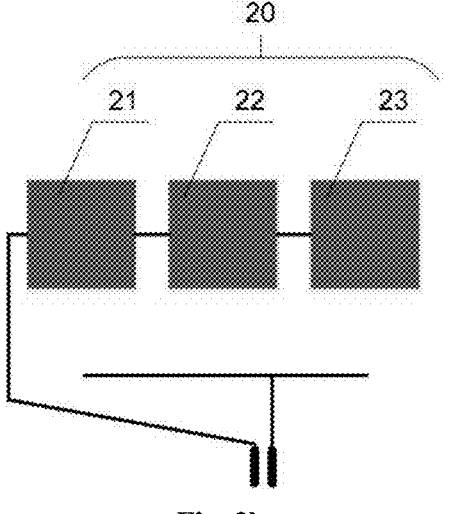
FIG. 3b is a schematic top view of the first electrode of the structure of FIG. 3.
Figure 3C:
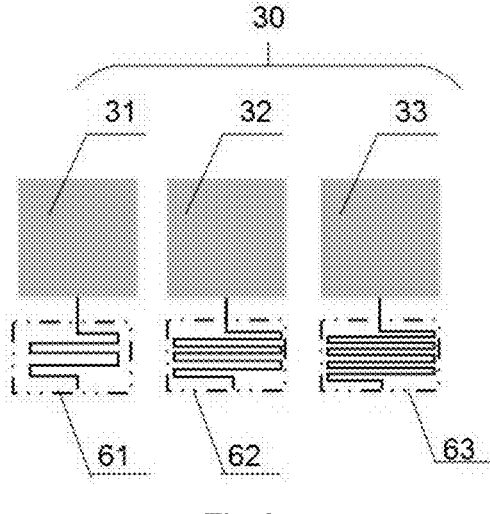
FIG. 3c is a schematic top view of the second electrode and the voltage-dividing resistor of the structure of FIG. 3.

An embodiment of the present disclosure provides a micro-fluidic chip. Referring to FIGS. 1 and 1a, the micro-fluidic chip protected by the present application includes a fast-channel functional region A'. Referring to FIGS. 3 to 3c, an embodiment of a structure of the fast-channel functional region A' is shown, in which a micro-fluidic chip 100 includes a first base substrate 10, a first electrode 20, a second electrode 30, an insulating layer 40, a dielectric layer 50, and a voltage-dividing resistor 60, and the positions and the connection relationship thereof may refer to the description in the first embodiment and the drawings, and are not repeated herein. The second embodiment is different from the first embodiment in that, in the second embodiment, the first electrode 20 includes sub-blocks of the first electrode spaced apart from each other along the first direction, which have the same shape and are coupled to each other, and the sub-blocks of the second electrode have the same shape as the sub-blocks of the first electrode. An orthographic projection of the sub-blocks of the first electrode on the first base substrate 10 and an orthographic projection of the sub-blocks of the second electrode on the first base substrate coincide, so that the capacitances formed between the sub-blocks of the first electrode and the respective sub-blocks of the second electrode are further ensured to be the same.

Third Embodiment

Figure 4:
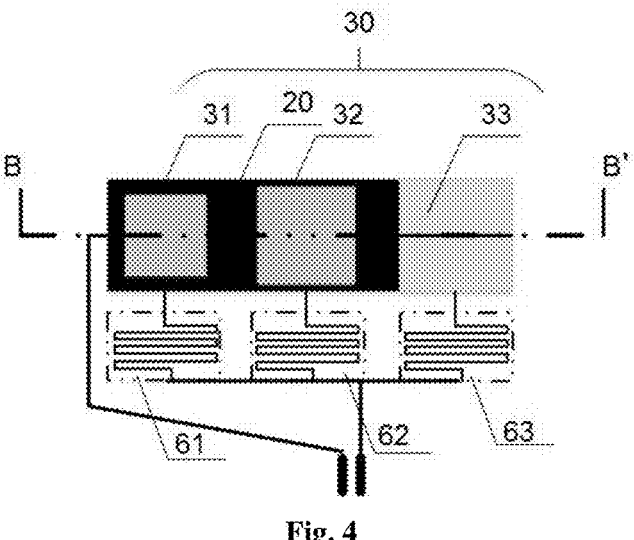
FIG. 4 is a schematic top view of another embodiment of the region A' of the micro-fluidic chip of FIG. 1.

An embodiment of the present disclosure provides a micro-fluidic chip. Referring to FIGS. 1 and 1*a*, the micro-fluidic chip protected by the present application includes a fast-channel functional region A'. Referring to FIGS. 4 to 4*c*, another embodiment of a structure of the fast-channel functional region A' is shown, in which a micro-fluidic chip 100 includes a first base substrate 10, a first electrode 20, a second electrode 30, an insulating layer 40, a dielectric layer 50, and a voltage-dividing resistor 60, and the positions and the connection relationship thereof may refer to the description in the first embodiment and the drawings, and are not repeated herein. The third embodiment is different from the first embodiment in that the first voltage-dividing resistor 61, the second voltage-dividing resistor 62 and the third voltage-dividing resistor 63 have the same resistance value, the insulating layer 40 is disposed between the first electrode 20 and the second electrode 30, and the thickness of the insulating layer 40 is uniform in the region corresponding to the first electrode 20; overlapping areas of the orthographic projection of the first electrode 20 on the first base substrate 10 and an orthographic projection of the sub-blocks of the second electrode on the first base substrate 10 gradually increase along the first direction.

In the present embodiment, referring to FIGS. 4 to 4*b*, the first electrode 20 is a strip electrode, and the orthographic projection of the second electrode 30 on the first base substrate 10 is located within the orthographic projection of the first electrode on the first base substrate 10; areas of the plurality of sub-blocks of the second electrode are gradually increased along the first direction.

As shown in FIGS. 4*a* to 4*c*, one end of the first voltage-dividing resistor 61, one end of the second voltage-dividing resistor 62, and one end of the third voltage-dividing resistor 63 are coupled to the first sub-block 31, the second sub-block 32, and the third sub-block 33 of the second electrode, respectively, and the other end of each of the three voltage-dividing resistors is coupled to a ground wire through a first via (not shown) in the insulating layer. The number of the voltage-dividing resistors are not limited to three as shown in the figures, and there may be n voltage-dividing resistors, where 1<n<5, and n is an integer. The resistance values of the first voltage-dividing resistor 61, the second voltage-dividing resistor 62, and the third voltage-dividing resistor 63 are the same. Overlapping areas of the orthographic projection of the first electrode 20 on the first base substrate 10 and the orthographic projections of the sub-blocks of the second electrode on the first base substrate 10 gradually increase along the first direction, which is a direction in which the droplet is predicted to flow. The obtained coupling voltage of a sub-block of the second electrode coupled with a corresponding voltage-dividing resistor 60 is positively correlated with the resistance value of the coupled voltage-dividing resistor, and is used for driving a corresponding droplet to quickly pass through.

In order to enable the droplet to move at a uniform speed in the channel, the overlapping areas of the orthographic projection of the first electrode 20 on the first base substrate 10 and the orthographic projections of the sub-blocks of the second electrode on the first base substrate 10 satisfy the condition that the obtained voltages of the sub-blocks of the second electrode linearly increase in the first direction.

When the micro-fluidic chip operates, driving voltages are applied on the electrodes at both sides of the flow channel, and droplets can be driven to flow in the flow channel. In the embodiments of the present application, a common voltage is applied to the fourth electrode 80, and a driving voltage is applied to the first electrode 20, and due to the coupling voltage effect, different voltage values are generated on the first sub-block 31, the second sub-block 32, and the third sub-block 33 of the second electrode, respectively, so as to drive the droplet to move quickly through a designated area, thereby avoiding that the movement time of the droplet is determined by the on-off switching time of the electrode, namely, determined by the response time of the relay, and accelerating the movement speed of the droplet.

The fabrication method and the working principle related to the present embodiment may refer to the description in the first embodiment, and are not repeated herein.

Fourth Embodiment

Figure 5:
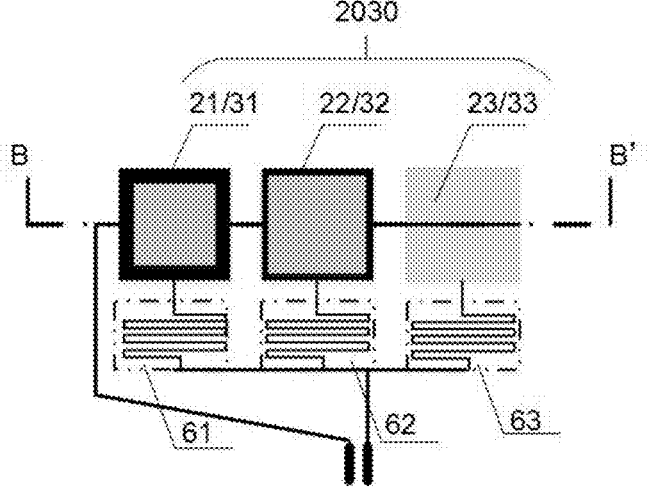
FIG. 5 is a schematic top view of another embodiment of the region A' of the micro-fluidic chip of FIG. 1.
Figure 5A:
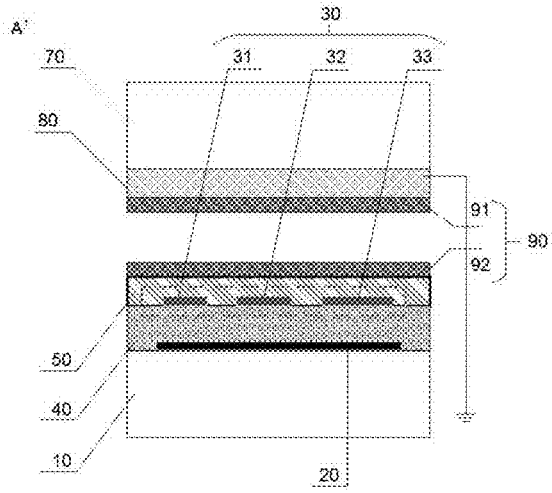
FIG. 5a is a schematic cross-sectional view of the structure of FIG. 5 taken along the direction BB'.
Figure 5B:
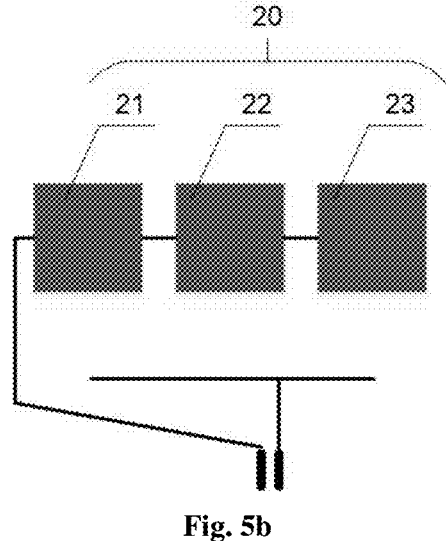
FIG. 5b is a schematic top view of the first electrode of the structure of FIG. 5.
Figure 5C:
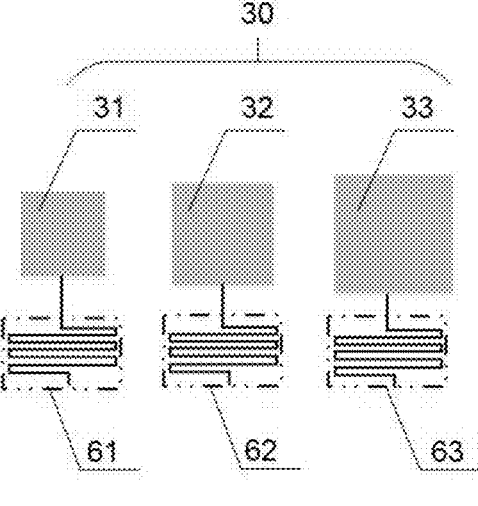
FIG. 5c is a schematic top view of the second electrode and the voltage-dividing resistor of the structure of FIG. 5.

An embodiment of the present disclosure provides a micro-fluidic chip. Referring to FIGS. 1 and 1*a*, the micro-fluidic chip protected by the present application includes a fast-channel functional region A'. Referring to FIGS. 5 to 5*c*, an embodiment of a structure of the fast-channel functional region A' is shown, in which a micro-fluidic chip 100 includes a first base substrate 10, a first electrode 20, a second electrode 30, an insulating layer 40, a dielectric layer 50, and a voltage-dividing resistor 60, and the positions and the connection relationship thereof may refer to the descriptions in the first embodiment and the third embodiment and the drawings, and are not repeated herein.

In the present embodiment, the first electrode 20 includes a plurality of sub-blocks of the first electrode spaced apart from each other along the first direction, which have the same shape and are coupled to each other, and an orthographic projection of the second electrode 30 on the first base substrate 10 is located within an orthographic projection of the first electrode on the first base substrate 10, and overlapping areas of the orthographic projection of the first electrode 20 on the first base substrate 10 and the orthographic projections of the sub-blocks of the second electrode on the first base substrate 10 gradually increase along the first direction, which is a direction in which the droplet is predicted to flow. The obtained coupling voltage of a sub-block of the second electrode coupled with a corresponding voltage-dividing resistor 60 is positively correlated with the resistance value of the coupled voltage-dividing resistor, and is used for driving a corresponding droplet to quickly pass through.

Fifth Embodiment

Figure 6:
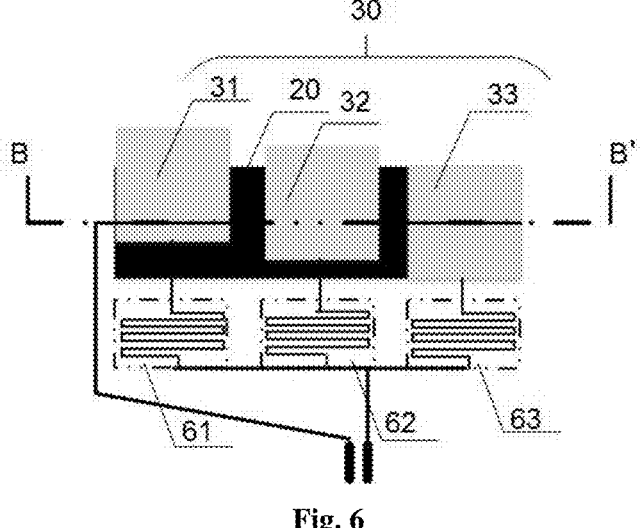
FIG. 6 is a schematic top view of another embodiment of the region A' of the micro-fluidic chip of FIG. 1.

An embodiment of the present disclosure provides a micro-fluidic chip. Referring to FIGS. 1 and 1*a*, the micro-fluidic chip protected by the present application includes a fast-channel functional region A'. Referring to FIGS. 6 to 6*c*, another embodiment of a structure of the fast-channel functional region A' is shown, in which a micro-fluidic chip 100 includes a first base substrate 10, a first electrode 20, a second electrode 30, an insulating layer 40, a dielectric layer 50, and a voltage-dividing resistor 60, and the positions and the connection relationship thereof may refer to the description in the first embodiment and the drawings, and are not repeated herein. The fifth embodiment is different from the first embodiment in that the first voltage-dividing resistor 61, the second voltage-dividing resistor 62 and the third voltage-dividing resistor 63 have the same resistance value, the insulating layer 40 is disposed between the first electrode 20 and the second electrode 30, and the thickness of the insulating layer 40 is uniform in the region corresponding to the first electrode 20; an orthographic projection of the second electrode 30 on the first base substrate 10 partially overlaps an orthographic projection of the first electrode 20 on the first base substrate 10, and overlapping areas of the orthographic projection of the first electrode 20 on the first base substrate 10 and the orthographic projections of the sub-blocks of the second electrode on the first base substrate 10 gradually increase along the first direction.

Figure 6A:
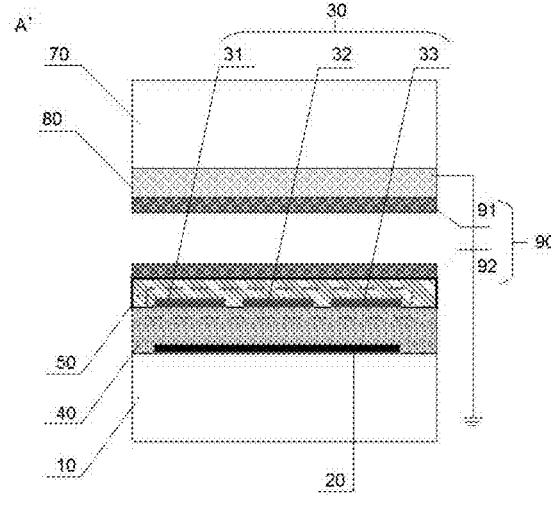
FIG. 6a is a schematic cross-sectional view of the structure of FIG. 6 taken along the direction BB'.
Figure 6B:
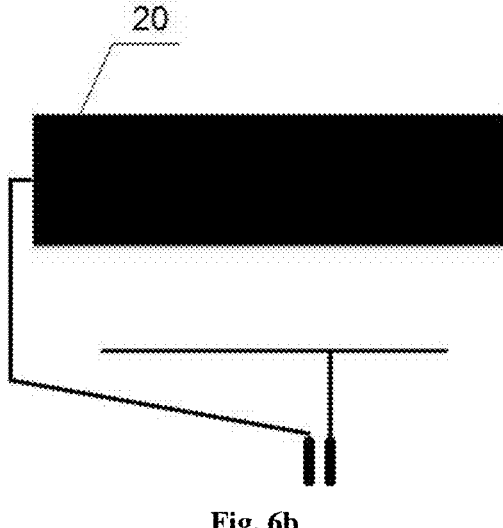
FIG. 6b is a schematic top view of the first electrode of the structure of FIG. 6.
Figure 6C:
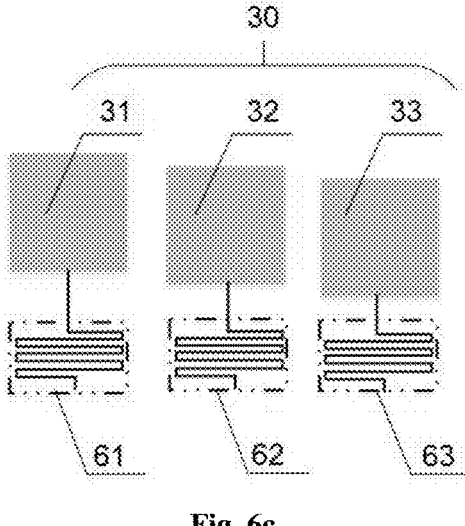
FIG. 6c is a schematic top view of the second electrode and the voltage-dividing resistor of the structure of FIG. 6.

As shown in FIGS. 6*a* to 6*c*, one end of the first voltage-dividing resistor 61, one end of the second voltage-dividing resistor 62, and one end of the third voltage-dividing resistor 63 are coupled to the first sub-block 31, the second sub-block 32, and the third sub-block 33 of the second electrode, respectively, and the other end of each of the three voltage-dividing resistors is coupled to a ground wire through a first via (not shown) in the insulating layer. The number of the voltage-dividing resistors are not limited to three as shown in the figure, and there may be n voltage-dividing resistors, where 1<n<5, and n is an integer. The resistance values of the first voltage-dividing resistor 61, the second voltage-dividing resistor 62, and the third voltage-dividing resistor 63 are the same, and the shapes of the sub-blocks of the second electrode are the same. An orthographic projection of a sub-block of the second electrode on the first base substrate 10 partially overlaps an orthographic projection of a respective sub-block of the first electrode on the first base substrate 10, and overlapping areas thereof gradually increase along the first direction, which is a direction in which the droplet is predicted to flow. The obtained coupling voltage of a sub-block of the second electrode coupled with a corresponding voltage-dividing resistor 60 is positively correlated with the overlapping area of the orthographic projection of the first electrode 20 on the first base substrate 10 and the orthographic projection of the sub-block of the second electrode on the first base substrate 10, and is used for driving a corresponding droplet to quickly pass through.

In order to enable the droplet to move at a uniform speed in the channel, the overlapping areas of the orthographic projection of the first electrode 20 on the first base substrate 10 and the orthographic projections of the sub-blocks of the second electrode on the first base substrate 10 satisfy the condition that the obtained voltages of the sub-block of the second electrode linearly increase in the first direction.

When the micro-fluidic chip operates, driving voltages are applied on the electrodes at both sides of the flow channel, and droplets can be driven to flow in the flow channel. In the embodiments of the present application, a common voltage is applied to the fourth electrode 80, and a driving voltage is applied to the first electrode 20, and due to the coupling voltage effect, different voltage values are generated on the first sub-block 31, the second sub-block 32, and the third sub-block 33 of the second electrode corresponding to the first electrode 20, respectively, so as to drive the droplet to move quickly through a designated area, thereby avoiding that the movement time of the droplet is determined by the on-off switching time of the electrode, namely, determined by the response time of the relay, and accelerating the movement speed of the droplet.

The fabrication method and the working principle related to the present embodiment may refer to the description in the first embodiment, and are not repeated herein.

Sixth Embodiment

Figure 7:
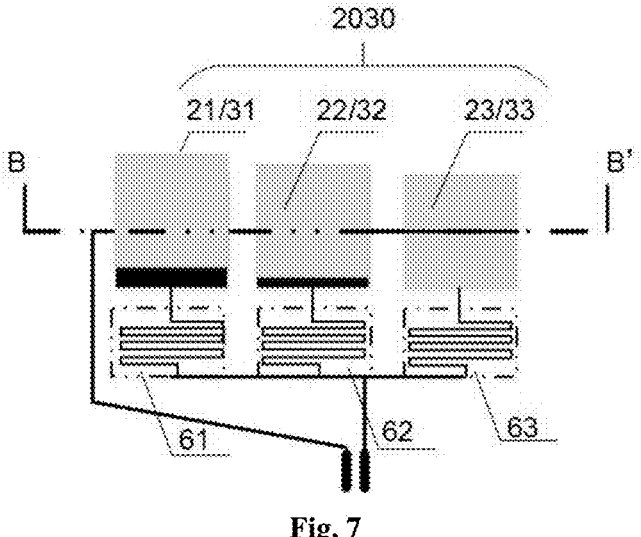
FIG. 7 is a schematic top view of another embodiment of the region A' of the micro-fluidic chip of FIG. 1.
Figure 7A:
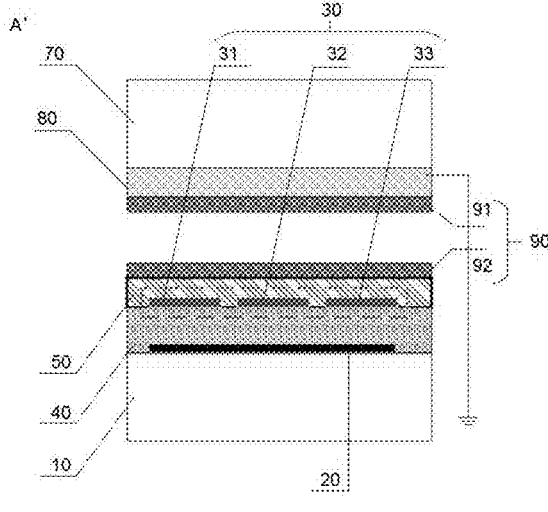
FIG. 7a is a schematic cross-sectional view of the structure of FIG. 7 taken along the direction BB'.
Figure 7B:
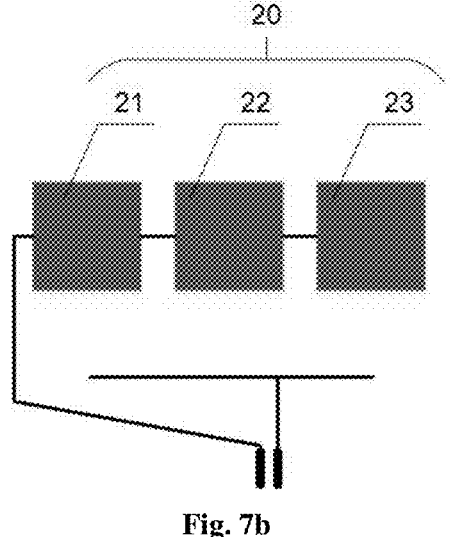
FIG. 7b is a schematic top view of the first electrode of the structure of FIG. 7.
Figure 7C:
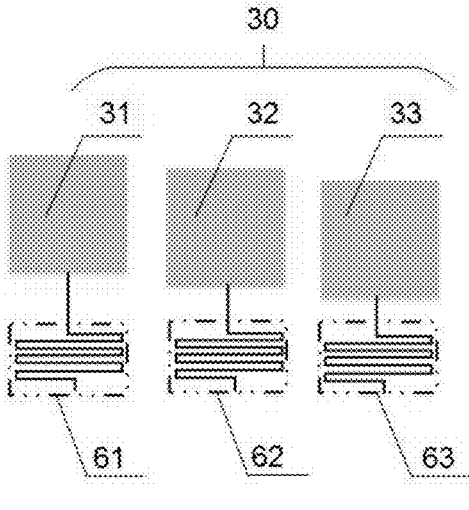
FIG. 7c is a schematic top view of the second electrode and the voltage-dividing resistor of the structure of FIG. 7.
Figure 8:
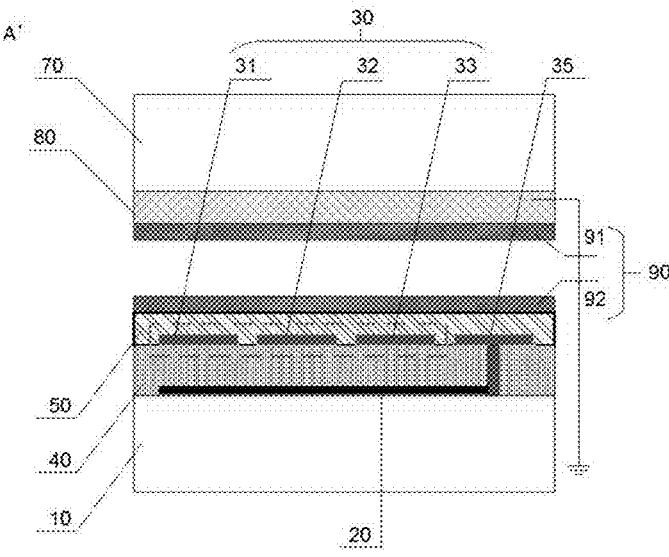
FIG. 8 is a schematic cross-sectional view of another embodiment of a fast-channel region of the micro-fluidic chip of FIG. 1.

An embodiment of the present disclosure provides a micro-fluidic chip. Referring to FIGS. 1 and 1*a*, the micro-fluidic chip protected by the present application includes a fast channel functional region A'. Referring to FIGS. 7 to 7*c*, an embodiment of a structure of the fast-channel functional region A' is shown, in which a micro-fluidic chip 100 includes a first base substrate 10, a first electrode 20, a second electrode 30, an insulating layer 40, a dielectric layer 50, and a voltage-dividing resistor 60, and the positions and the connection relationship thereof may refer to the description in the first embodiment and the fifth embodiment and the drawings, and are not repeated herein.

In the present embodiment, the first electrode 20 includes a plurality of sub-blocks of the first electrode spaced apart from each other along the first direction, which have the same shape and are coupled to each other, and the sub-blocks of the second electrode have the same shape as the sub-blocks of the first electrode. The shapes of the sub-blocks of the second electrode are the same; an orthographic projection of a sub-block of the second electrode on the first base substrate 10 partially overlaps an orthographic projection of a respective sub-block of the first electrode on the first base substrate 10, and overlapping areas thereof are gradually reduced along the first direction.

Seventh Embodiment

The same structures as those in the first to sixth embodiments are not described again, and the difference is that the micro-fluidic chip in the present embodiment of the present disclosure further includes an electrode block 34 and a third electrode 35. The electrode block 34 and the third electrode 35 are disposed in the same layer as the second electrode 30 and are located at two ends of the second electrode 30, and are used for sending out and receiving droplets. The third electrode 35 is coupled to the first electrode 20 through a third via hole 43. Taking the second electrode 30 including three electrode blocks as an example, this structure involves five driving electrodes, but only two bonding electrodes are used, and all of the first sub-block 31 of the second electrode, the second sub-block 32 of the second electrode, and the third sub-block 33 of the second electrode share one ground electrode, so that the number of the used bonding electrodes is effectively reduced, and the flow of the manipulated droplets is improved.

When the micro-fluidic chip operates, driving voltages are applied to the electrodes at both sides of the flow channel, and droplets can be driven to flow in the flow channel. In the embodiments of the present application, a common voltage is applied to the fourth electrode 80, and a driving voltage is applied to the first electrode 20, and due to the coupling voltage effect, different voltage values are generated on the first sub-block 31, the second sub-block 32, and the third sub-block 33 of the second electrode corresponding to the first electrode 20, respectively, so as to drive the droplet to move quickly through a designated area, thereby avoiding that the movement time of the droplet is determined by the on-off switching time of the electrode, namely, determined by the response time of the relay, and accelerating the movement speed of the droplet. In the present embodiment, the third electrode 35 is coupled to the first electrode through the third via hole 43. The structure involves five driving electrodes, but only two bonding electrodes are used, and all of the first sub-block 31 of the second electrode, the second sub-block 32 of the second electrode, and the third sub-block 33 of the second electrode share one ground electrode, so that the number of the used bonding electrodes is effectively reduced, and the flow of the manipulated droplets is improved. When transport of the droplet from the electrode block 34 to the third electrode 35 is required, the transport of the droplet can be realized only by applying a corresponding voltage to the third electrode 35, and the process is as follows: firstly, an input signal having a frequency of 1 KHz and voltage of 40 Vrms is selected and used, then signals are simultaneously sent to the first electrode 20 and the third electrode 35, and the droplet can move.

Eighth Embodiment

Figure 12:
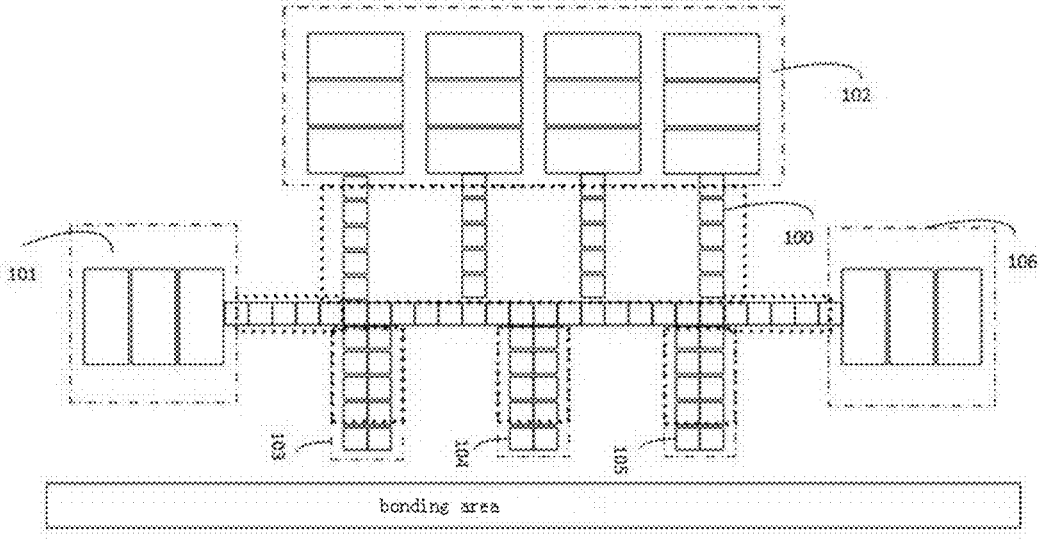
FIG. 12 is a schematic block diagram of a library preparation chip provided in an embodiment of the present disclosure.

The embodiments of the present disclosure further provide a library preparation chip. Referring to FIG. 12, the library preparation chip further includes a sample distribution module 101, a reagent distribution module 102, a mixing module 103, a reaction module 104, a washing module 105, and a sample output module 106. The sample distribution module, the reagent distribution module and the sample output module are coupled to other modules through the micro-fluidic chip structure; and each of the mixing module, the reaction module and the washing module includes the micro-fluidic chip structure.

It is noted that in the drawings, the sizes of layers and regions may be exaggerated for clarity of illustration. Also, it will be understood that when an element or layer is referred to as being "on" another element or layer, it can be directly on the other element or intervening layer(s) may also be present. In addition, it will be understood that when an element or layer is referred to as being "under" another element or layer, it can be directly under the other element or intervening layer(s) or element(s) may be present. In addition, it will also be understood that when a layer or element is referred to as being "between" two layers or elements, it can be the only layer between the two layers or elements, or more than one intermediate layer or element may also be present. Like reference numerals refer to like elements throughout the specification.

Other embodiments of the present application will be apparent to those skilled in the art from consideration of the specification and practice of the present disclosure disclosed herein. This application is intended to cover any variations, uses, or adaptations of the present application following general principles of the application and including common knowledge or conventional technical means in the technical field that are not disclosed in this application. It is intended that the description and embodiments be considered as exemplary only, with a true scope and spirit of the application being indicated by the appended claims.

It will be understood that the present application is not limited to the precise arrangements that have been described above and shown in the drawings, and that various modifications and changes may be made without departing from the scope thereof. The scope of the application is limited only by the appended claims.

What is claimed is:

1. A micro-fluidic chip, comprising:
    a first base substrate;

a first electrode on the first base substrate and electrically coupled to a wire at a driving end;
    a second electrode on a side of the first electrode away from the first base substrate and spaced apart and electrically insulated from the first electrode, the second electrode comprising a plurality of sub-blocks of the second electrode, and an orthographic projection of the second electrode on the first base substrate being at least partially overlapped with an orthographic projection of the first electrode on the first base substrate; and
    voltage-dividing resistors electrically coupled in parallel with each other, wherein each of the voltage-dividing resistors is coupled between a corresponding one of the plurality of sub-blocks of the second electrode and a ground wire,
    wherein the micro-fluidic chip further comprises a dielectric layer on a side of the second electrode away from the first base substrate and a second lyophobic layer on a side of the dielectric layer away from the first base substrate and the second lyophobic layer is configured to support a droplet and is in direct contact with the droplet,
    wherein resistance values of the voltage-dividing resistors gradually increase in a first direction, and voltages between the plurality of sub-blocks of the second electrode and the ground wire gradually increase in the first direction in proportion to the resistance values of the voltage-dividing resistors, and
    wherein each of the voltage-dividing resistors is formed by a conductive line having a square-wave shape, and lengths of the conductive lines forming the voltage-dividing resistors are different from one another and gradually increase in the first direction.

2. The micro-fluidic chip of claim 1, wherein
    an insulating layer is disposed between the first electrode and the second electrode, and a thickness of the insulating layer is uniform in a region corresponding to the first electrode; and
    overlapping areas of the orthographic projection of the first electrode on the first base substrate and the orthographic projection of the second electrode on the first base substrate are the same.

3. The micro-fluidic chip of claim 2, wherein
    the first electrode comprises a plurality of sub-blocks of the first electrode spaced apart from each other in the first direction, having the same shape and coupled to each other, and each of the plurality of sub-blocks of the first electrode has a same shape as each of the plurality of sub-blocks of the second electrode; and
    an orthographic projection of a sub-block of the plurality of sub-blocks of the first electrode on the first base substrate and an orthographic projection of a respective sub-block of the plurality of sub-blocks of the second electrode on the first base substrate coincide.

4. The micro-fluidic chip of claim 3, wherein
    the plurality of sub-blocks of the second electrode are equally spaced along the first direction.

5. The micro-fluidic chip of claim 1, further comprising a third electrode coupled to the first electrode.

6. The micro-fluidic chip of claim 5, wherein the third electrode and the second electrode are disposed in a same layer, an insulating layer is disposed between the first electrode and a fourth electrode, and the third electrode is coupled to the first electrode through a first via hole penetrating through the insulating layer.

7. The micro-fluidic chip of claim 1, wherein the ground wire and the first electrode are disposed in a same layer, the voltage-dividing resistors and the second electrode are disposed in a same layer, an insulating layer is disposed between the voltage-dividing resistors and the ground wire, and the ground wire is coupled to the voltage-dividing resistors one by one through a second via hole penetrating through the insulating layer.

8. The micro-fluidic chip of claim 1, wherein a number of the plurality of sub-blocks of the second electrode is from 2 to 4.

9. The micro-fluidic chip of claim 1, wherein the micro-fluidic chip further comprises a third electrode coupled to the first electrode, the third electrode and the second electrode are disposed in a same layer, an insulating layer is disposed between the first electrode and the third electrode and the second electrode disposed in the same layer, and the third electrode is coupled to the first electrode through a first via hole penetrating through the insulating layer, and the third electrode is configured to receive a signal such that a droplet above the second electrode is driven through coupling effect between the first electrode and the second electrode due to the signal.

10. The micro-fluidic chip of claim 1, wherein each of the voltage-dividing resistors is directly coupled between the corresponding one of the plurality of sub-blocks of the second electrode and the ground wire.

11. A library preparation chip, comprising the micro-fluidic chip of claim 1, and further comprising a sample distribution module, a reagent distribution module, a mixing module, a reaction module, a washing module, and a sample output module, wherein the sample distribution module, the reagent distribution module and the sample output module are coupled to other modules through a structure of the micro-fluidic chip; and each of the mixing module, the reaction module and the washing module comprises a structure of the micro-fluidic chip.

12. A method for controlling and driving a droplet to quickly transport the droplet, applied to the micro-fluidic chip of claim 1, comprising:

providing a signal to the first electrode to drive the droplet to move.

13. The method of claim 12, wherein the signal is an alternating current signal having an effective value from 10 Vrms to 70 Vrms.

* * * * *